United States Patent
Desagulier et al.

(10) Patent No.: US 7,721,426 B2
(45) Date of Patent: May 25, 2010

(54) METHOD OF PRODUCING ELECTRICALLY CONDUCTIVE PATTERNS ON A SUBSTRATE

(75) Inventors: Christian Desagulier, Paris (FR); Alain Lacombe, Chambourcy (FR); Bruno Esmiller, Villennes sur Seine (FR)

(73) Assignee: Astrium SAS, Paris (FR)

( * ) Notice: Subject to any disclaimer, the term of this patent is extended or adjusted under 35 U.S.C. 154(b) by 195 days.

(21) Appl. No.: 11/815,447

(22) PCT Filed: Feb. 20, 2006

(86) PCT No.: PCT/FR2006/000373

§ 371 (c)(1),
(2), (4) Date: Aug. 2, 2007

(87) PCT Pub. No.: WO2006/090050

PCT Pub. Date: Aug. 31, 2006

(65) Prior Publication Data

US 2008/0210456 A1    Sep. 4, 2008

(30) Foreign Application Priority Data

Feb. 23, 2005    (FR) .................................. 05 01815

(51) Int. Cl.
*H05K 3/02* (2006.01)
(52) U.S. Cl. .............................. 29/846; 29/825; 29/847; 29/852
(58) Field of Classification Search ................... 29/825, 29/846, 847, 852
See application file for complete search history.

(56) References Cited

U.S. PATENT DOCUMENTS

| 3,264,402 A | * | 8/1966 | Shaheen et al. | ............. 174/264 |
| 4,724,465 A | | 2/1988 | Davies | |
| 4,738,746 A | | 4/1988 | Clariou | |
| 5,364,493 A | | 11/1994 | Hunter, Jr. et al. | |
| 5,369,881 A | * | 12/1994 | Inaba et al. | .................... 29/846 |
| 5,666,722 A | * | 9/1997 | Tamm et al. | ................... 29/847 |

FOREIGN PATENT DOCUMENTS

| EP | 0261356 | 3/1987 |
| EP | 0241331 | 10/1987 |
| EP | 0787558 | 8/1997 |
| FR | 2596230 | 9/1987 |

OTHER PUBLICATIONS

International Search Report dated Jul. 3, 2006.

\* cited by examiner

*Primary Examiner*—C. J Arbes
(74) *Attorney, Agent, or Firm*—Dickinson Wright PLLC

(57) ABSTRACT

The invention concerns a method for producing electrically conductive patterns on a non-developable surface of an insulating substrate, and the resulting device. The invention is characterized in that it consists in: coating the non-developable surface (6) uniformly with a layer of electrically conductive material (9), which is in turn coated with a layer of protective material (10), and then, using a mobile laser head, eliminating by laser ablation the portions of said protective substance layer (10) which do not cover said electrically conductive patterns, then eliminating the portions of said electrically conductive material (9) exposed by the elimination of said portions of said protective material layer (10).

6 Claims, 2 Drawing Sheets

METHOD OF PRODUCING ELECTRICALLY CONDUCTIVE PATTERNS ON A SUBSTRATE

Figure 1:
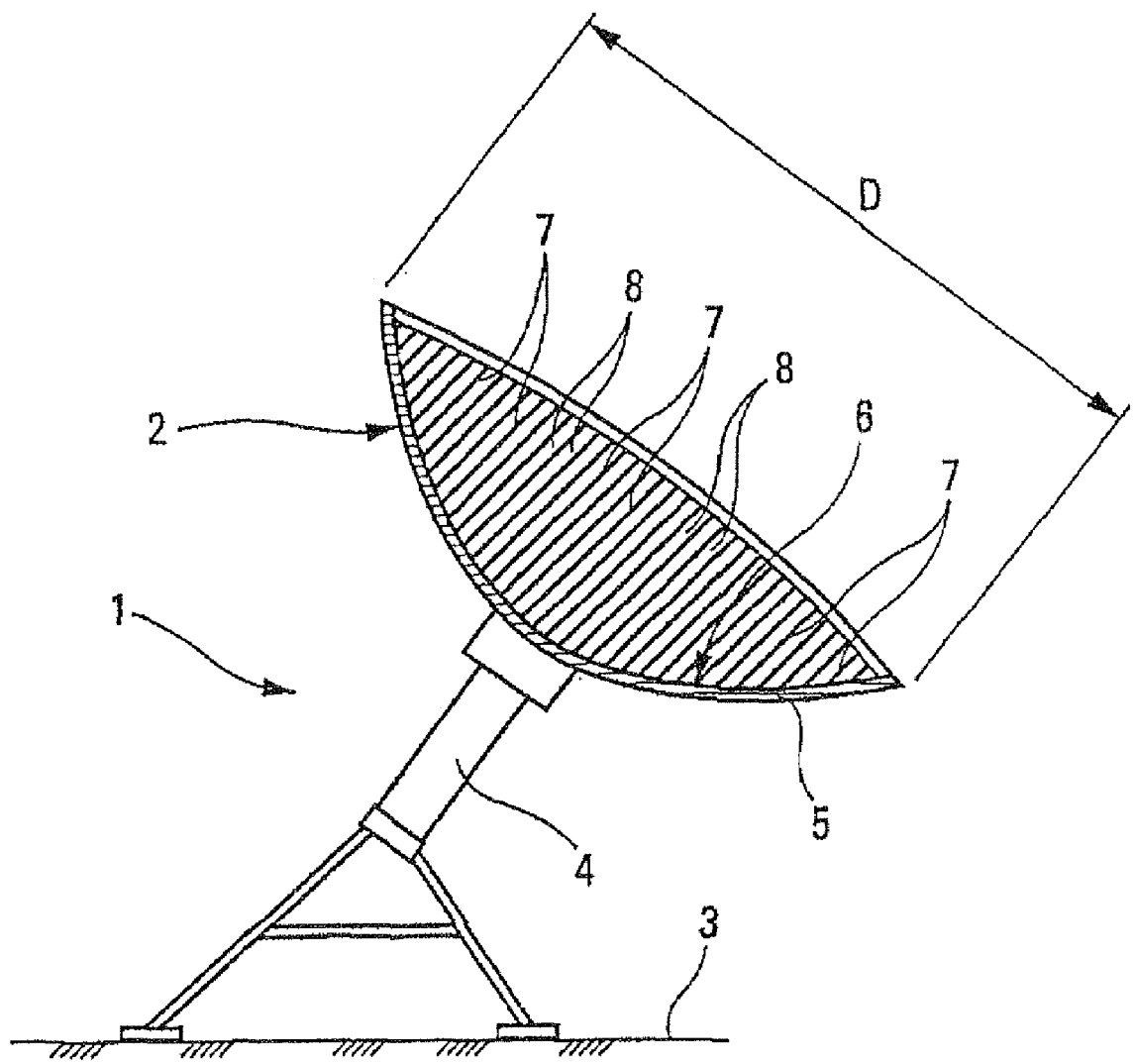

The present invention relates to a method for producing electrically conductive patterns on a non-developable three-dimensional surface of an insulating substrate. Although not exclusively, it is particularly suitable for the production of a polarizing grid (frequency re-use antenna) or a series of resonant patterns (dichroic antennas) on a surface shaped at least approximately as a paraboloid, hyperboloid, etc. The invention also relates to devices comprising such a substrate, said non-developable surface of which carries said electrically conductive patterns which are produced according to the method.

It is known that in order to produce a printed circuit on a plane face of an electrically insulating substrate, said surface is first covered uniformly with a layer of a metal such as copper or aluminum, after which this metal layer is itself covered uniformly with a photosensitive product. The photosensitive product is subsequently exposed to a light beam, through a mask corresponding to the printed circuit to be obtained. Such exposure renders resistant the parts of the photosensitive product lying on top of the parts of the metal layer intended to form the printed circuit, so that suitable chemical attack subsequently makes it possible to remove selectively the portions of the photosensitive product which have not been rendered chemically resistant by the exposure, as well as the metal layer portions lying under them.

Following said chemical attack, the desired printed circuit is therefore obtained.

In the case in which it is desired to apply this method to the production of printed circuits on a surface which is no longer plane, but is a non-developable three-dimensional surface, difficulties would be encountered when applying the mask onto said surface. This is because for obvious reasons of convenience in production and precision, such a mask is plane. It would thus be necessary either to cut up said mask into pieces of smaller area and apply it by juxtaposing said pieces on said non-developable surface, or to make said mask from a flexible material which can be applied thereon by deformation. In both cases, the printed circuit obtained would be imprecise as regards both the shape and the position of the patterns which constitute it.

It will furthermore be noted that if, as a variant, said printed circuit is produced on a plane auxiliary substrate intended to be applied subsequently onto the non-developable surface, the same difficulties would be encountered as those mentioned above in respect of the masks.

In order to overcome these drawbacks and make it possible to produce precise printed circuits directly on non-developable three-dimensional surfaces, the method described in documents U.S. Pat. No. 4,738,746; EP-0 241 331 and FR-2 596 230 may be employed. In this method, just as in the one summarized above, said surface which is then a non-developable three-dimensional surface is initially covered uniformly with a layer of an electrically conductive material, which is in turn covered with a layer of a protective material. After forming said layers of conductive material and protective material, the contour of said patterns is traced mechanically on them by means of a tool which etches grooves whose depth is at least equal to the thickness of said protective layer, then said layers are subjected to the action of a chemical agent capable of selectively attacking said electrically conductive material without attacking said protective material, this chemical attack operation being continued over a sufficient time for said electrically conductive material to be removed over its entire thickness underneath said grooves, after which the parts of said electrically conductive material layer which lie outside said patterns are separated from the substrate by peeling.

By virtue of this latter method, it is thus possible to produce electrically conductive patterns directly on non-developable three-dimensional surfaces without having to resort to a mask or an auxiliary substrate with which, moreover, it would be technically difficult to obtain patterns that are as precise in terms of both their shape and their position on said surfaces.

In such prior art, a tool provided with at least one etching tip or at least one cutting blade is used for tracing the contours of said electrically conductive patterns, said tool being mounted in a machine (for example with numerical control and five axes of rotation) responsible for moving it relative to the non-developable surface.

It is thus possible for devices with a non-developable surface carrying electrically conductive patterns to be produced in an easy and precise way. For example, carrying out this known method makes it possible to produce high-quality grid reflectors which are adapted to operate in the Ku band (from 11 to 18 GHz) and are formed by at least one network of parallel conductive wires, these conductive wires having a width of 0.25 mm, a thickness of 35 micrometers and being distributed with a pitch of 1 mm over a surface shaped least approximately as a paraboloid, the aperture diameter of which may reach 2300 mm.

This prior method, however, presents limitations of a technical and economic nature. If instead of a grid reflector intended to operate in the Ku band, for example, it is desired to produce such a reflector intended for the Ka band (from 20 to 30 GHz), then the width, thickness and distribution pitch of the conductive wires become smaller (for example respectively 0.125 mm, 18 micrometers and 0.5 mm) and this entails difficulties due to the smaller width and the smaller thickness of the conductive wires, and of the inter-wire zones:

- the tracing parameters of the conductive patterns (pressure and arrangement of the etching tips or blades) and the chemical attack parameters (duration) become more sensitive, which results in geometrical defects and weakening of the conductive wires during the peeling;
- edge effects become a significant when tracing the conductive wires, since the tips or the blades push back the thin conductive material in the manner of a ploughshare and reduce the adhesion of the conductive wires on the substrate; and
- the inter-wire zones are fragile and are therefore liable to break during the peeling.

As a consequence it is necessary to ensure that the tool always exerts perfect tracing, and the conduct of the method needs to be slowed, which increases the manufacturing costs of such a reflector.

It is an object of the present invention to overcome these drawbacks.

To this end, according to the invention the method for producing electrically conductive patterns on a non-developable three-dimensional surface of an electrically insulating substrate, which method starts by uniformly covering said non-developable surface with a layer of an electrically conductive material, which is in turn covered with a layer of a protective material, after which the portions of said protective material layer which do not cover zones of said electrically conductive material layer intended to form said patterns are removed, then the portions of said electrically conductive material layer uncovered by removing said portions of said protective material layer are removed, is noteworthy in that the removal of the portions of the protective material layer which do not cover said zones of said electrically conductive material layer intended to form said patterns is carried out by laser ablation with the aid of a laser head which is moved, relative to said non-developable surface covered with said electrically conductive material layer and with said protective material layer, in order to cover all the portions of said protective material layer which do not cover said zones of said electrically conductive material layer intended to form said electrically conductive patterns.

The present invention thus obviates any mechanical contact with the protective material layer and with the electrically conductive material layer during the production of said electrically conductive patterns, which makes it possible to avoid the drawbacks mentioned above concerning the method according to document U.S. Pat. No. 4,738,746.

It will be noted that document U.S. Pat. No. 5,364,493 already describes a method for producing electrically conductive patterns on a substrate by laser ablation. This document provides a fixed laser beam passing through a plane mask, however, so that the described method cannot be suitable for producing electrically conductive patterns on a non-developable three-dimensional surface.

For moving the laser head provided by the method according to the invention, it is advantageously possible to use a machine similar to the one mentioned above, intended for carrying out the prior method of document U.S. Pat. No. 4,738,746.

In an advantageous embodiment, the portions of the electrically conductive material layer which are uncovered by the laser ablation of said portions of the protective material layer are removed by the action of a chemical agent capable of attacking the electrically conductive material without attacking said protective material.

Preferably, said chemical agent may be iron perchloride, when said layer is made of copper.

Moreover, said protective material insensitive to the action of said chemical agent may be an organic varnish.

After removal of the portions of said electrically conductive material layer which are uncovered by the laser ablation of said portions of said protective material layer, the residues of said protective material layer covering said electrically conductive patterns may either be removed or left in place.

The invention furthermore relates to a device, for example a reflector, which comprises an electrically insulating substrate carrying electrically conductive patterns on one of its non-developable three-dimensional surfaces, and which is noteworthy in that said electrically conductive patterns are produced by carrying out the method according to the invention as specified above.

The figures of the appended drawing will clearly show how the invention may be embodied. In these figures, identical references denote similar elements.

FIG. 1 schematically represents an antenna device, the reflector of which is provided with electrically conductive patterns produced by carrying out the method according to the present invention.

Figure 2:
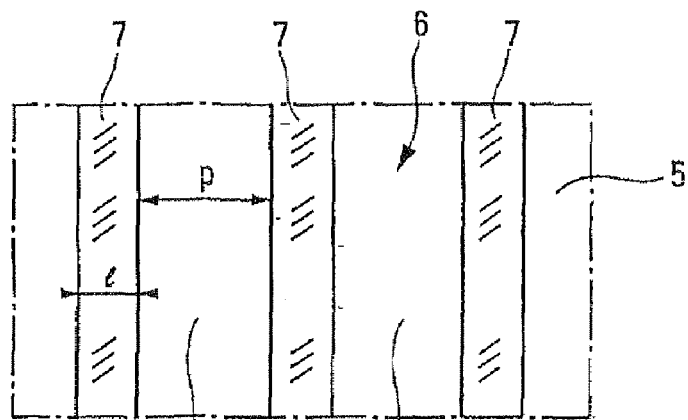

FIG. 2 is an enlarged schematic front view of a part of the reflector in FIG. 1, illustrating the shape and the arrangement of said electrically conductive patterns.

FIGS. 3A to 3D schematically illustrate steps of the method according to the present invention in section, applied to production of the electrically conductive patterns in FIGS. 1 and 2.

Although it is concave and not developable, in FIGS. 2 and 3A to 3D the reflector's surface carrying said electrically conductive patterns is represented as being plane for convenience of the drawing.

FIG. 1 schematically represents an antenna device 1 provided with an antenna reflector 2 (represented in diametral section) supported by a bearing surface 3 via a support 4.

The reflector 2 comprises an electrically insulating substrate 5 (for example made of composite material), whose surface 6 next to the support 4 is concave and has a non-developable shape, for example at least approximately the shape of a paraboloid, a hyperboloid, etc. On this non-developable three-dimensional surface the reflector 2 carries electrically conductive patterns, formed by mutually parallel and equidistant conductors 7 in the example represented. Each conductor 7 has a rectangular cross section of width 1 and thickness e, and the distribution pitch of the parallel conductors 7 is denoted by p. A separating zone 8 in the form of a strip, having a width equal to p, is thus formed between two adjacent conductors 7 (see also FIG. 2).

In order to produce the reflector 2 illustrated schematically by FIGS. 1 and 2, the non-developable surface 6 of the substrate 5 is first coated uniformly with a layer 9 of an electrically conductive material (see FIG. 3A) with a thickness equal to e. Such a layer 9 may, for example, be vacuum deposited on the surface 6 or attached thereon by adhesive bonding. It may be metallic and consist, for example, of copper or aluminum.

Next, by any known means, said electrically conductive material layer 9 is covered with a layer 10 of a protective material, for example an organic varnish.

Figure 3A:
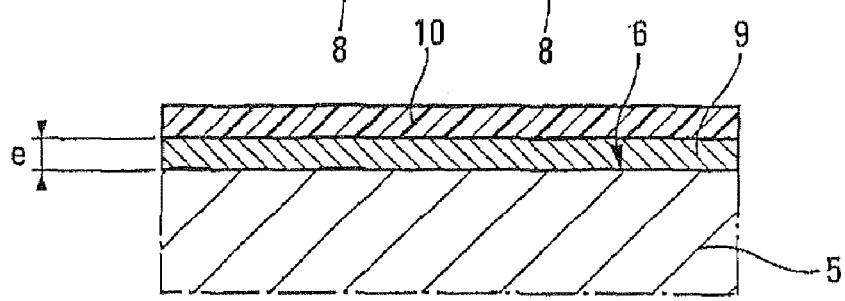
Figure 3B:
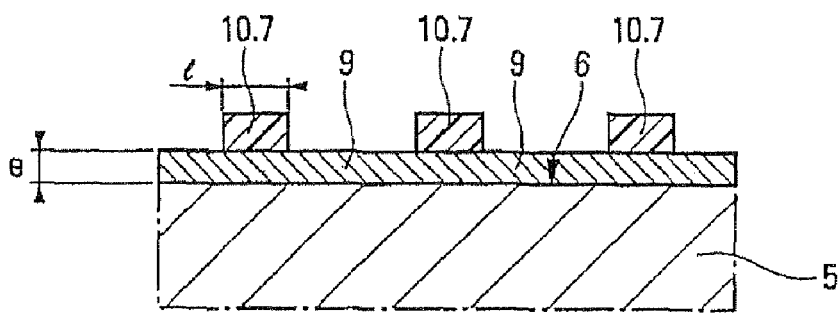

According to the present invention and as illustrated by FIG. 3B, a mobile laser head is subsequently used to carry out laser ablation of the portions of the protective material layer 10 which lie on top of the separating zones 8, i.e. which do not cover the zones of the layer 9 intended to form the conductors 7. On the electrically conductive material layer 9, this laser ablation therefore leaves only lines 10.7 of protective material remaining on top of the future conductors 7 and having a width equal to 1.

After the operation illustrated by FIG. 3B, the protective lines 10.7 and the conductive layer 9 are subjected to the action of a chemical agent, applied for example by spraying or immersion.

This chemical agent attacks the electrically conductive material layer 9 between the lines 10.7, without attacking said lines 10.7 of protective material. The chemical agent, which are then selectively removes the conductive layer 9, is for example iron perchloride when the layer 9 is made of copper.

Figure 3C:
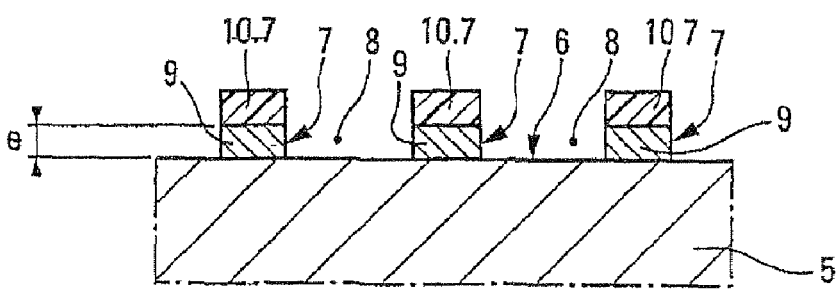

The action of the chemical agent on the conductive layer 9 is continued until the latter has been removed over its entire thickness underneath the separating zones 8 (FIG. 3C). This results in the formation of the conductors 7.

Rinsing is subsequently carried out on all of the substrate 5 and said partially cut layers 9 and 10.

Figure 3D:
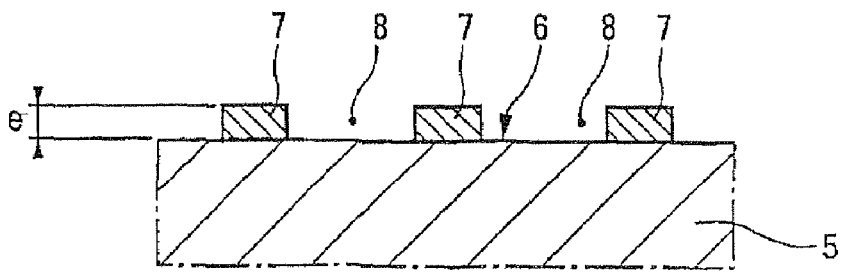

Optionally, the lines 10.7 covering the conductors 7 are furthermore removed (FIG. 3D). The protective material of the layer 10 (for example an organic varnish) may nevertheless be selected so that it has characteristics making it compatible with the environment (for example in space) when the reflector will be needed to operate. The lines 10.7 may thus be left in place on the conductors 7 and serve to protect them, for example against corrosion.

From the preceding description, it will be noted that the method according to the present invention is:
  economical and fast, notably the fact that the speed of laser ablation is very fast (for example 0.3 m/s) and that it is possible to use multiple ablation laser sources simultaneously;
  reversible, since a programming error of the machine or an ablation anomaly can be corrected; the ablation can be resumed after partial reconstitution of the layer 10 of protective material, without affecting the substrate 5 and the conductive layer 9;

robust, since it obviates the mechanical cutting of very fine patterns; and versatile, since it makes it possible to produce conductive patterns with varied shapes.

By way of example, it will mentioned below that carrying out the method according to the invention has made it possible to manufacture a reflector such as the one represented in FIGS. 1 and 2 with l=0.125 mm, p=0.5 mm and e=18 micrometers, the diameter D of the aperture of said reflector being equal to 2300 mm.

The invention claimed is:

1. A method for producing electrically conductive patterns on a non developable three dimensional surface of an electrically insulating substrate, which method starts by uniformly covering said non developable surface with a layer of an electrically conductive material, which is in turn covered with a layer of a protective material, after which the portions of said protective material layer which do not cover zones of said electrically conductive material layer intended to form said patterns are removed, then the portions of said electrically conductive material layer uncovered by removing said portions of said protective material layer are removed, wherein the removal of the portions of the protective material layer which do not cover said zones of said electrically conductive material layer intended to form said patterns is carried out by laser ablation with the aid of a mobile laser head which is moved, relative to said non developable surface covered with said electrically conductive material layer and with said protective material layer, in order to cover all the portions of said protective material layer which do not cover said zones of said electrically conductive material layer intended to form said electrically conductive patterns.

2. The method as claimed in claim 1, wherein the portions of the electrically conductive material layer which are uncovered by the laser ablation of said portions of the protective material layer are removed by the action of a chemical agent capable of attacking the electrically conductive material without attacking said protective material.

3. The method as claimed in claim 2, wherein the chemical agent which removes said conductive material layer is iron perchloride, when said conductive material layer is made of copper.

4. The method as claimed in claim 2, wherein said protective material insensitive to the action of said chemical agent is an organic varnish.

5. The method according to claim 1, wherein after removal of the portions of said electrically conductive material layer which are uncovered by the laser ablation of said portions of said protective material layer, the residues of said protective material layer covering said electrically conductive patterns are removed.

6. The method according to claim 1, wherein after removal of the portions of said electrically conductive material layer which are uncovered by the laser ablation of said portions of said protective material layer, the residues of said protective material layer covering said electrically conductive patterns are left in place.

* * * * *